United States Patent [19]

Tanizawa et al.

[11] Patent Number: 4,654,548

[45] Date of Patent: Mar. 31, 1987

[54] COMPLEMENTARY LOGIC CIRCUIT

[75] Inventors: Tetsu Tanizawa, Kawasaki; Osam Ohba, Inagi, both of Japan

[73] Assignee: Fujitsu Limited, Kawasaki, Japan

[21] Appl. No.: 627,576

[22] Filed: Jul. 3, 1984

[30] Foreign Application Priority Data

Jul. 8, 1983 [JP] Japan .............................. 58-123498
Jul. 8, 1983 [JP] Japan .............................. 58-123501

[51] Int. Cl.⁴ ................. H03K 19/017; H03K 19/094
[52] U.S. Cl. .................................... 307/450; 307/451; 307/581; 307/585
[58] Field of Search ............... 307/446, 450, 475, 451, 307/579, 585, 270, 581

[56] References Cited

U.S. PATENT DOCUMENTS 4,129,879 12/1978 Tantraporn et al. ................. 357/23

FOREIGN PATENT DOCUMENTS 3013471 4/1980 Fed. Rep. of Germany.

OTHER PUBLICATIONS

Patent Abstract of Japan, vol. 4, No. 8 (E166), 22nd Jan. 1980, p. 103 E 166; & JP-A-54 148469 (Oki Denki Kogyo K.K.) 20-11-1979.
Patent Abstract of Japan, vol. 5, No. 3 (E-40)[675], 10th Jan. 1981 & JP-A-55 134960, (Daini Seikosha K.K.) 21-10-1980.

*Primary Examiner*—Stanley D. Miller
*Assistant Examiner*—M. R. Wambach
*Attorney, Agent, or Firm*—Armstrong, Nikaido, Marmelstein & Kubovcik

[57] ABSTRACT

A complementary logic circuit which has large power handling capacity, high switching speed and still has low power consumption is disclosed. The circuit of the present invention is composed from a first stage comprising a complementary MIS-FET, and an output stage comprising a complementary vertical FET. The gate of the V-FET is arranged so as to serve as the drain or source of the MIS-FET. In such an arrangement, the steps of fabricating the IC are reduced and the packing density is increased. By varying the connection of positive and negative voltage sources, the circuit can be operated as an inverting or non-inverting logic circuit.

5 Claims, 8 Drawing Figures

COMPLEMENTARY LOGIC CIRCUIT

BACKGROUND OF THE INVENTION

The present invention relates to a complementary logic circuit, more precisely, to a complementary IC (Integrated Circuit) which enables high speed switching of signals at high current level without increasing power consumption. The circuit is realized by combining MIS (Metal Insulator Semiconductor) transistors and vertical FETs (Field Effect Transistors).

A complementary MIS (C-MIS) type logic circuit is widely used as a very low power consumption circuit, but it has the disadvantages of rather low switching speed and rather low power handling capacity. Therefore, it was difficult to drive large scale and complicated logic circuits by C-MIS.

There were attempts to overcome such defects of complementary MIS circuits by combining the FETs with bipolar transistors, which have high speed and high power handling capacity. But there appeared other difficulties on such improved circuits, as will be described later, the improvement was inadequate. Moreover, these improvements increased the steps of fabrication, and imposed undesirable effects on the yield, cost and reliability of the devices.

SUMMARY OF THE INVENTION

The object of the present invention is, therefore, to provide a complementary logic circuit which has high switching speed and high power handling capacity, and still operates with low power consumption.

Another object of the present invention is to provide a complementary logic circuit which is easy to fabricate by ordinary semiconductor technology.

The foregoing object is attained by combining C-MIS with vertical FETs. For an inverting type logic (FIG. 3a), the circuit by the present invention comprises a first (input) stage circuit which is composed of a pair of p-channel and n-channel MIS transistors, and a second (output) stage circuit which is composed of a pair of n-channel and p-channel vertical FETs. For a non-inverting type logic (FIG. 3b), the logic circuit by the present invention comprises a first (input) stage circuit which is composed of a pair of n-channel and p-channel MIS transistors, and a second (output) stage circuit which is composed of a pair of n-channel and p-channel vertical FETs. Each pair of the MIS transistors and the vertical FETs composes a respectively complementary circuit.

By using the complementary vertical FETs, the above mentioned defects of the complementary MIS logic circuit are eliminated, and it reduces the steps of the fabrication process and makes it easier to manufacture the ICs by conventional semiconductor technology.

The effects and features of the invention may be understood with reference to the following detailed description of the invention, together with the accompanying drawings.

BRIEF DESCRIPTION OF THE DRAWINGS

FIG. 1 shows a conventional prior art complementary logic circuit, wherein.

FIG. 2 shows a circuit diagram of an improved complementary logic circuit by using bipolar transistors, wherein.

FIG. 3 shows a circuit diagram of the present invention, wherein.

In each drawing, figures having a suffix "a" indicate inverting type logic circuits, and figures having a suffix "b" indicate non-inverting type logic circuits. Similar notations or reference numerals designate similar or corresponding parts throughout the drawings.

DETAILED DESCRIPTION OF THE INVENTION

As mentioned before, though the complementary FET (C-FET) logic circuit has merits of low power consumption and ease of fabrication, it also has defects.

Figure 1A:
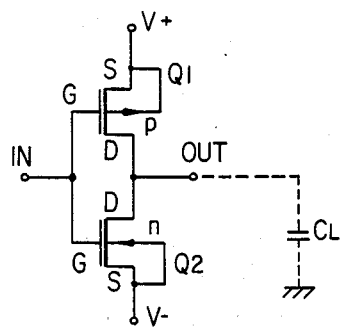
FIG. 1a shows an inverting type circuit.
Figure 1B:
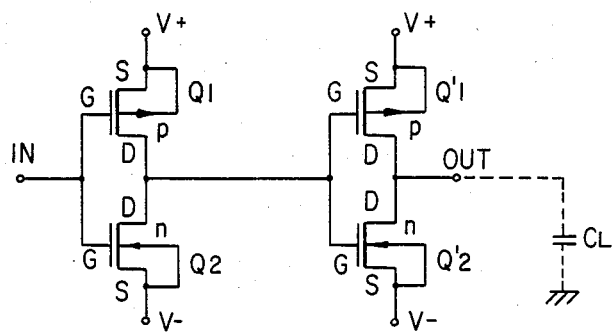
FIG. 1b shows a non-inverting type circuit.

FIG. 1 shows examples of prior art complementary logic circuits, where, FIG. 1a shows a C-MIS(Complementary Metal Insulator Semiconductor type) inverter, and FIG. 1b shows a non-inverting logic circuit which is composed of serially connected C-MIS inverters. Each C-MIS inverter circuit is composed from p-channel and n-channel MIS transistors $Q_1$ and $Q_2$ or $Q'_1$ and $Q'_2$ respectively. Source electrodes of each p-channel MIS transistor and n-channel MIS transistor are connected respectively to the positive and negative side of voltage source $V_+$ and $V_-$.

The input signal IN is applied to the gate electrodes of MIS transistors $Q_1$ and $Q_2$, which are connected to each other. The inverted output signal is taken out from the drain electrodes of $Q_1$ and $Q_2$ which are also connected to each other. This is the output signal OUT of the inverter. For the non-inverting circuit, the output signal of the first inverter is applied to the second inverter $Q'_1$ and $Q'_2$), then the output signal OUT becomes a non-inverted signal.

The operation is as follows, when the input signal is high level (H), the transistor $Q_1$ is OFF and the transistor $Q_2$ is ON, so the output signal of the inverter becomes low level (L). On the contrary, when the input signal is L, the transistor $Q_1$ is ON and the transistor $Q_2$ is OFF and the OUT becomes H. For the non-inverting circuit, the output signal of the first inverter is inverted once more by the second inverter $Q'_1$ and $Q'_2$ (the operation of these transistors are reverse to that of the first inverter), and the OUT becomes a non-inverted signal.

In the circuits of FIG. 1, one of the p-channel or n-channel MIS transistors in each stage of inverter is OFF so long as the input signal is in a stable state, regardless of whether the input signal level is H or L. Therefore, the current which would otherwise flow directly from the positive side of voltage source $V_+$ to the negative side of voltage source $V_-$ through the inverter circuits is always pinched off, so, the power consumption of the complementary logic circuit becomes very low.

The ON-state resistance of an MIS transistors is high, therefore it cannot handle a large current reliably. Moreover, if the circuit is highly integrated or the logic circuit becomes complicated, it is inevitable that the stray capacitance of the circuit becomes large, such stray capacitance is indicated by $C_L$ in FIG. 1. Therefore, when such a large circuit is driven by a C-MIS circuit, the time constant for discharging or charging up the capacitance $C_L$ becomes large, and the operation speed of the circuit becomes low.

Figure 2A:
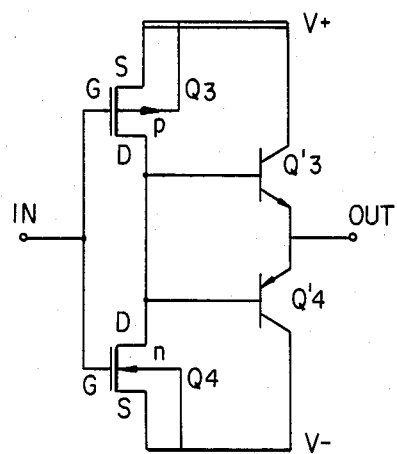
FIG. 2a shows an inverting type circuit.

Attempts to overcome such problems were proposed. The most common attempt is to use both MIS and bipolar transistors in a common configuration, (for example, Japanese laid open patent, the Provisional Publication No. 148469/'79 and 45207/'80 by T. Suzuki). These improvements can be summarized as shown in FIG. 2. FIG. 2a shows an inverting type circuit corresponding to FIG. 1a. The first stage is an inverting type complementary MIS transistors $Q_3$ (p-channel) and $Q_4$ (n-channel), and the second stage is a non-inverting buffer amplifier composed by complementary bipolar transistors $Q'_3$ (npn) and $Q'_4$ (pnp) transistor, namely when the input signal of the buffer amplifier is H (high) the npn transistor $Q'_3$ is ON and the pnp transistor $Q'_4$ is OFF, so the output signals is H and vice versa. Therefore, the overall circuit is an inverting type.

Figure 2B:
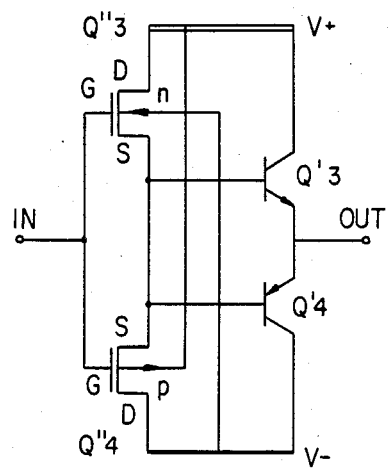
FIG. 2b shows a non-inverting type circuit.

The non-inverting type circuit can be realized by serially connecting the inverting type circuit. But, it can also be realized as shown in FIG. 2b. The first stage circuit of FIG. 2B is composed of complementary MIS transistors $Q''_3$ (n-channel) and $Q''_4$ (p-channel). The second stage is similar to that of FIG. 2a. The operation of the circuit can be easily understood from the analogy of the foregoing description for one skilled in the art, so it is omitted from the disclosure for the sake of simplicity.

The bipolar transistors in FIG. 2 are connected in emitter follower connection, therefore, when the switching action is over and in stable state, the base current is almost zero by the feed back from the output. So, the current which runs from the positive side of voltage source $V_+$ to the negative side of voltage source $V_-$ is almost zero, similar to the circuit of FIG. 1.

Such a circuit is commonly used in audio signal amplifiers and it is known that there is a "dead zone" in which the speed of the switching action becomes very low (in audio amplifiers the distortion increases and many improvements are proposed), when the input signal is at a level as determined by the following conditions $$\text{Buffer OUT} - V_{BE} < \text{Buffer IN} < \text{Buffer OUT} + V_{BE} \quad (1)$$

where Buffer OUT and Buffer IN are signal levels of output and input signals of the bipolar transistors respectively. $V_{BE}$ is the threshold voltage of the bipolar transistor. The reason can be explained as follows, assume that the input level of the buffer stage (second stage) is in H level, the transistor $Q'_3$ is ON and the output level (Buffer OUT) becomes $V_H - V_{BE}$, where $V_H$ is the signal level of the H state. In this state, Buffer IN = Buffer OUT + $V_{BE}$. When the switching action begins the level of Buffer IN decreases, but Buffer OUT remains at $V_H - V_{BE}$ because of the stray capacitance of the load. As the Buffer IN decreases it becomes lower than Buffer OUT + $V_{BE}$, and the transistor $Q'_3$ turns OFF. In this state, the transistor $Q'_4$ is still OFF, therefore, the stray capacitance is not discharged, since both transistors $Q'_3$ and $Q'_4$ are OFF. At this instant the switching action is lost. The "dead state" continues until, Buffer IN decreases to Buffer OUT − $V_{BE}$. This is the "dead zone". When the Buffer IN becomes lower than Buffer OUT − $V_{BE}$, the transistor $Q'_4$ becomes ON, and the Buffer OUT is pulled down quickly.

Similarly, when the Buffer IN is L (low state), the transistor $Q'_4$ is ON and $Q'_3$ is OFF, so Buffer OUT = $V_L + V_{BE}$, where $V_L$ is the signal level of L. Therefore, Buffer IN = Buffer OUT − $V_{BE}$. As the switching action begins the level of Buffer IN increases, but Buffer OUT remains at its initial value $V_L + V_{BE}$. So, the transistor $Q'_4$ becomes turns OFF and the "dead zone" begins. It continues until Buffer IN = Buffer OUT + $V_{BE}$. When Buffer IN increases more than this value, the transistor $Q'_3$ turns ON and the Buffer OUT is pulled up rapidly.

In like manner, each time when the signal changes from H to L or vice versa, the signal level must cross the dead zone. $V_{BE}$ is approximately 0.8 volt, therefore, the width of the dead zone is approximately 1.6 volts. This value is too large to neglect compared to the source voltage or the level of the signal H, which is usually about 5 volts. Therefore, the switching speed is significantly decreased.

The present invention intends to improve the above defect by replacing the bipolar transistors with vertical FETs. The vertical FET is a field effect transistor whose channel is provided vertically to the surface of the transistor (ordinary FET has a channel parallel to the surface of the device). The vertical FET is known from the early stage of FET technology (for example, by J. Nishizawa et al, "Field Effect Transistor vs. Analog Transistor" IEEE Transaction on Electron Devices ED-22, No. 4, Apr. 1975 or by J. Nishizawa "Static Induction Transistor Logic" Jap. Journal of Applied Physics, Vol. 17, 1978 Supplement 17-1) but it was not used so widely, becuase of complexity, of fabrication compared to an ordinary FET. But the invertors noticed that when the vertical FET is used for the buffer stage of the complementary MIS (C-MIS) circuit, it has many advantages which overcome the defects of the C-MIS circuits.

Figure 3A:
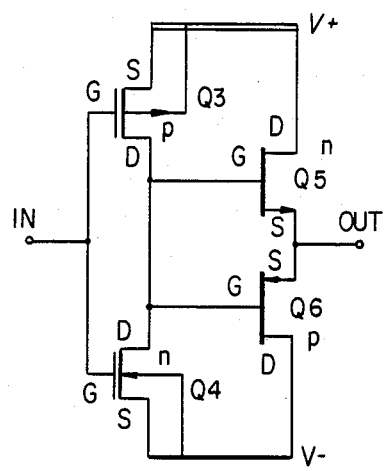
FIG. 3a shows an inverting type circuit.
Figure 3B:
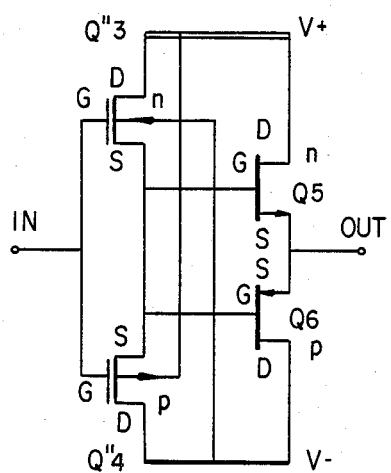
FIG. 3b shows a non-inverting type circuit.

FIG. 3 shows the circuit diagrams of the complementary logic circuit of the present invention. FIG. 3a is a circuit diagram of the inverting type, and FIG. 3b is a non-inverting type circuit. Each corresponds to FIG. 2a and FIG. 2b respectively. As can be seen in the figures, the buffer stage transistors $Q'_3$ and $Q'_4$ are replaced by vertical FETs $Q_5$ (n-channel) and $Q_6$ (p-channel) respectively. The operation is quite similar to the circuits of FIG. 2. Namely, the first stage is an inverting (FIG. 3a) or non-inverting (FIG. 3b) type C-MIS respectively and the second stage (buffer stage) is composed of non-inverting complementary vertical FETs.

The power handling capacity of a vertical FET is large, therefore, the first defect of the C-MIS circuit, the small power handling capacity is eliminated. Another defect of the bipolar buffer stage circuit, the dead zone, can be eliminated by reducing the $V_{BE}$. As can be seen from the inequality (1), the dead zone can be reduced by reducing $V_{BE}$. The threshold voltage $V_{BE}$ of a bipolar transistor is determined by its composition, therefore, it almost impossible to reduce it. On the contrary, a V-FET can be designed as a normally ON type device (it can also be designed as a normally OFF type) and the threshold voltage is lower than that of a bipolar transistor, moreover a vertical FET can reduce the threshold voltage. The threshold voltage of a vertical FET can be reduced by increasing the width of the channel. It may be reduced by increasing the conductivity of the channel or by varying the impurity. Generally, the C-MIS is a surface device, that is the device is fabricated on the surface of the substrate. On the contrary, a V-FET (vertical FET) is buried in the substrate, therefore, it is possible to vary the impurity of the substrate partially at the portion of V-FET, without disturbing the surface devices. Therefore, it is possible to reduce the threshold voltage almost equal to zero. So, the dead zone is avoided.

Each of the complementary vertical FETs are connected in series between the positive and negative voltage sources, and in "either case in which the signals are low or high", one of the vertical FETS is in OFF state. The current flowing directly from positive source to the negative source is always pinched off, therefore, the dark current or power consumption of the circuit becomes very small.

Figure 4:
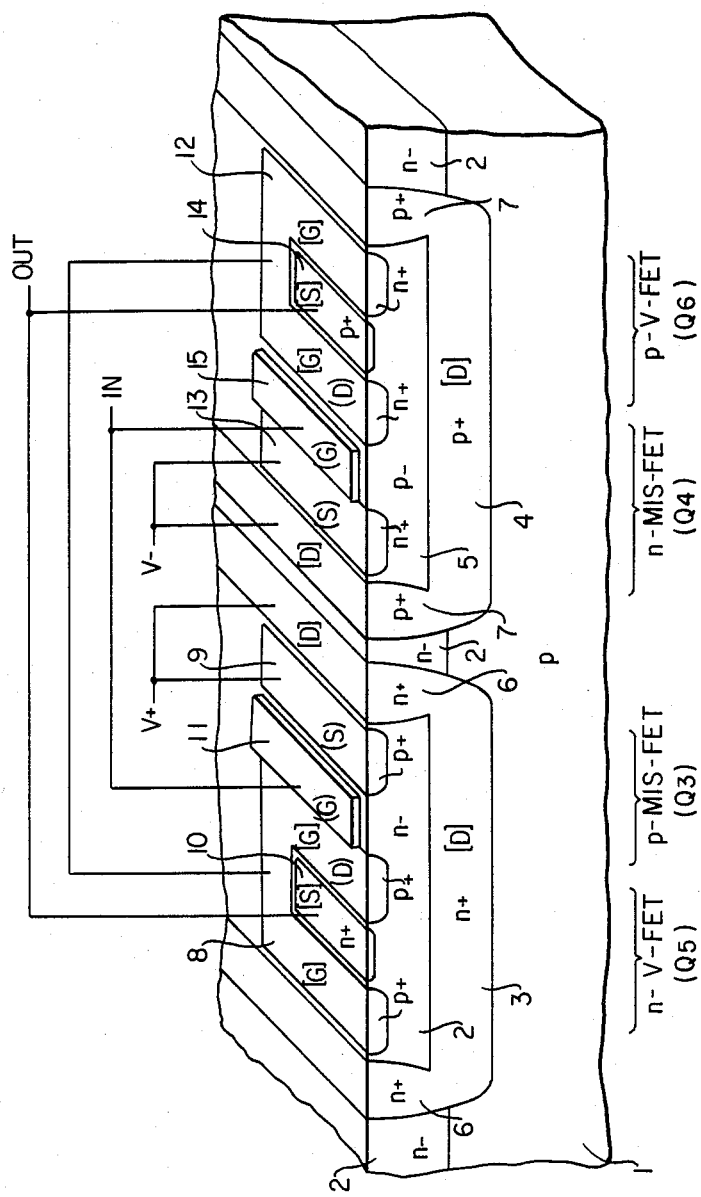
FIG. 4 is a partially cutaway view in perspective of a preferred embodiment of the present invention, illustrating the structure of an inverting type complementary logic circuit.

Further details of the invention will be disclosed with regard to some embodiments explaining the structure of the device. FIG. 4 shows the structure of a device realizing the circuit of FIG. 3a, illustrating the partial cut view of the device. In the figure, the reference numeral 1 designates an p-type substrate, upon which a $n^-$-type epitaxial layer 2 is formed, this layer is lightly doped by n-type impurity. On the boundary of the p-type substrate 1 and the epitaxial layer 2 are formed $N^+$-type buried layer 3 and $p^+$-type buried layer 4. These buried layers are formed before the epitaxial layer 2 is formed. With a usual method, the buried layers are linked respectively to the surface of the substrate by $N^+$-type region 6 or $p^+$-type region 7. These regions are usually fabricated by diffusion or ion implantation technology. On the surface of the $n^-$-layer 2, a first $p^+$-region 8 and a second $p^+$-region 9 are fabricated, they can be fabricated at the same time. Then a first $n^+$-region 10 is fabricated. As can be seen in the figure, the pattern of the first $p^+$-type region 8 is shaped to surround the first $n^+$-type pattern 10. These regions are fabricated by conventional method such as photo-lithographic masking and diffusion or ion implantation technology, and the surface of the substrate is covered with insulating film (not shown). Over the insulating film a gate electrode 11 is fabricated. Usually it is made of aluminum, or highly doped poly-silicon (poly-crystalline silicon).

By such a process, in the $n^-$-type epitaxial layer 2 lying over the $n^+$-type buried layer 3 a p-type MIS-FET (Metal Insulator Semiconductor type Field Effect Transistor) $Q_3$ and an n-channel V-FET $Q_5$ is fabricated. The p-channel FET $Q_3$ is composed from a drain which is the first $p^+$-region 8, denoted (D) in the figure, a gate 11 which is denoted (G) in the figure and a source which is the second $p^+$-region 9, denoted (S) in the figure. The n-channel V-FET $Q_5$ is composed from a source which is the first $n^+$-region 10, denoted [S] in the figure, a gate which is the first $p^+$-region 8, denoted [G] in the figure and a drain which is the buried $n^+$-layer 3, denoted [D] in the figure.

It will be understood by one skilled in the art that it is easy to fabricate these transistors by conventional semiconductor technology. Moreover, it will be seen from the figure, that a part of the gate [G] of the V-FET $Q_5$ is serving as the drain (D) of the p-channel FET $Q_3$. Therefore, the wiring to connect the gate [G] of the V-FET $Q_5$ to the drain (D) of the p-channel FET $Q_3$ can be eliminated. Therefore, a step in the process of fabricating the device is saved, and the packing density of the devices on the IC chip is increased.

On the upper part of the $p^+$ buried layer 4 is formed a $p^-$-layer 5 which is lightly doped by p-type impurity. This layer is formed by converting the $n^-$-layer 2 which is formed on the buried layer 4 by doping with p-type impurity by conventional diffusion or ion implantation technology. From the surface of the $p^-$-layer 5, a second $n^+$-region 12, a third $n^+$-region 13 and a third $P^+$-region 14 are formed, and a gate electrode 15 is formed on the surface of the $p^-$-layer. These are fabricated by a similar method as described before.

In such a manner on the $p^-$-layer 5 lying over the $p^+$-type buried layer 4, an n-channel MIS-FET $Q_4$ and a p-channel V-FET $Q_6$ are fabricated. The n-channel FET $Q_4$ is composed of a drain which is the second $n^+$-region 12, denoted (D) in the figure, a gate 15 which is denoted (G) in the figure and a source which is the third $n^+$-region 13, denoted (S) in the figure. The p-channel V-FET $Q_6$ is composed of a source which is the third $p^+$-region 14, denoted [S] in the figure, a gate which is the second $n^+$-region 12, denoted [G] in the figure and a drain which is the buried $p^+$-layer 4, denoted [D] in the figure. The second $n^+$-region 12 is surrounding the third $p^+$-region 14, and it is serving as the gate electrode of the p-channel V-FET $Q_6$ and the drain electrode of the n-channel MIS-FET $Q_4$. It will be clear for one skilled in the art that the merits and advantages of the process and packing density are quite the same as described before.

When the fabrication of the element devices described above is completed, the substrate is coated by a passivation film, and after making contact holes to respective electrode, the wiring is made by conventional method of semiconductor device manufacturing. These processes are all the same and familiar to conventional semiconductor device manufacturing, therefore the disclosure of such processes are omitted for the sake of simplicity. Thus for example, the electrodes of the devices are connected as shown in FIG. 4. In the figure, the gate electrodes of the p-channel FET $Q_3$ and the n-channel FET $Q_4$ are connected to each other and connected to an input terminal IN. The source electrodes of the n-channel V-FET $Q_5$ and p-channel V-FET $Q_6$ are connected to each other and connected to the output terminal OUT. The gate electrodes of n-channel V-FET $Q_5$ and p-channel V-FET $Q_6$ are connected to each other. The drain electrode of the n-channel V-FET $Q_5$ and the source electrode of the p-channel FET $Q_3$ are connected to each other and connected to the positive side of voltage source $V_+$, and the source electrode of the n-channel FET $Q_4$ and the drain electrode of the p-channel V-FET $Q_6$ are connected to each other and connected to the negative side of voltage source $V_-$.

As can be seen in FIG. 4, the channel regions of p-channel FET $Q_3$ and n-channel FET $Q_4$ are connected respectively to the drain of n-channel V-FET $Q_5$ and p-channel V-FET $Q_6$, so each channel region is biased with positive and negative supply voltage $V_+$ and $V_-$ respectively. Thus the circuit shown in FIG. 3a is realized.

Figure 5:
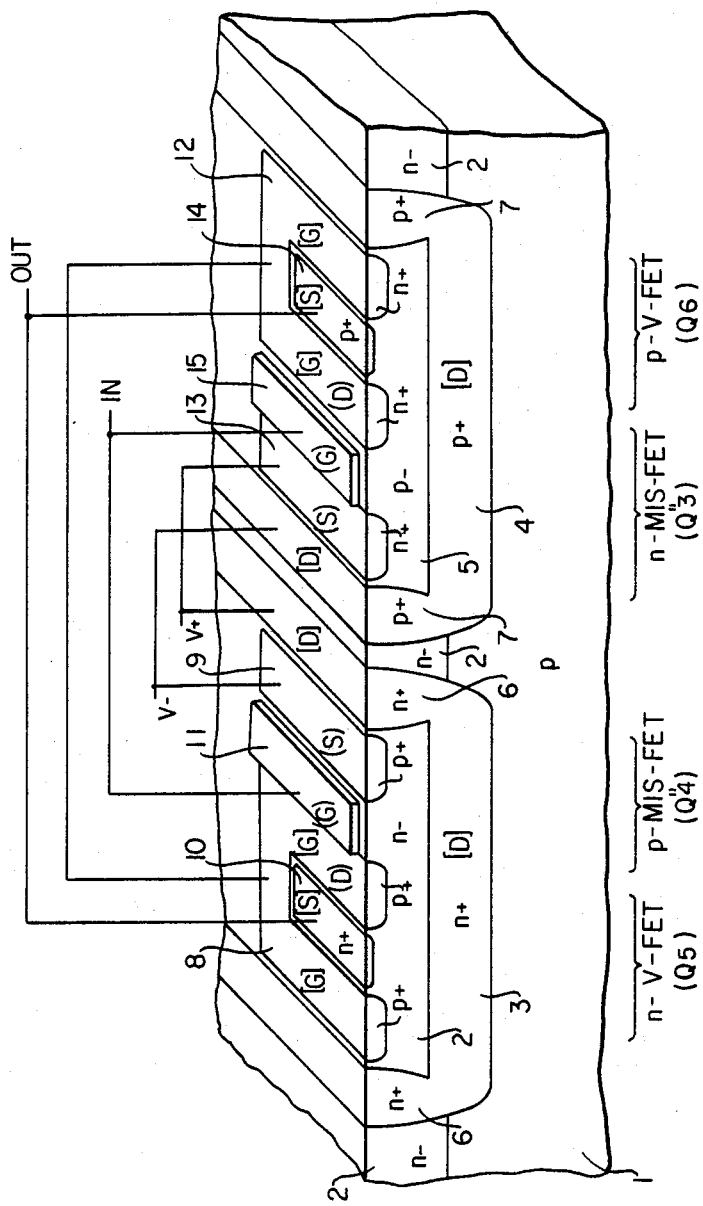
FIG. 5 is a partially cutaway view in perspective of another preferred embodiment of the present invention, illustrating the structure of a non-inverting type complementary logic circuit.

Once the device having a pattern as shown in FIG. 4 is fabricated, which corresponds to an inverting type logic shown in FIG. 3a, it is quite easy to change it to a non-inverting type logic of FIG. 3b. FIG. 5 shows the structure of the device realizing the circuit of FIG. 3b. Comparing the FIG. 5 with FIG. 4, one will notice that the patterns of electrodes fabricated in the bulk of semiconductor are quite similar. The difference is the power supply connection of the wiring is slightly altered, namely the second $p_+$-region 9 is connected to the drain 7 of the p-channel V-FET and the drain 6 of the n-channel V-FET is connected to the third $n^+$-region 13. And if the designation of the p-channel MIS-FET $Q_3$ is altered as $Q''_4$, and the designation of the n-channel MIS-FET $Q_4$ is altered as $Q''_3$, then the device becomes the circuit of FIG. 3b.

This is a great merit of the complementary logic circuit of the present invention. Namely, when the device having the pattern of FIG. 4 is fabricated, it can be easily used as an inverting type logic circuit or as a non-inverting type logic circuit merely by varying the wiring of the source voltage, there is no need to change the pattern and processing of diffusion, ion implantation and photo-lithograph etc., which are the main process of the semiconductor device fabrication. Moreover, there is no need to prepare the mask patterns for inverting and non-inverting circuits respectively. These merits are big advantages for manufacturing the ICs. It decreases the steps of production processing, and reduces the cost. It will increases the design freedom of the ICs, and as mentioned above, the packing density is increased.

It will be clear from the above description, that the complementary logic circuits of the present invention do not require any new process or device to fabricate it. It can be fabricated by conventional semiconductor processes.

What is claimed is:

1. A complementary logic IC (Integrated Circuit) comprising:
   a first stage circuit which comprises a p-channel MIS-FET (Metal Insulator Semiconductor type Field Effect Transistor) and an n-channel MIS-FET; and
   an output stage circuit which comprises an n-channel V-FET (Vertical FET) and a p-channel V-FET, wherein:
   the gate electrodes of said MIS-FETs are connected to each other and receive an input signal;
   the source electrodes of said V-FETs are connected to each other and provide an output signal;
   the gate of said n-channel V-FET is connected to one of the drain or the source of said p-channel MIS-FET; and
   the gate of said p-channel V-FET is connected to one of the drain or the source of said n-channel MIS-FET.

2. A complementary logic IC according to claim 1, wherein:
   the gate of said n-channel V-FET is connected to the drain of said p-channel MIS-FET;
   the gate of said p-channel V-FET is connected to the drain of said n-channel MIS-FET;
   the drain of said n-channel V-FET is connected to the source of said p-channel MIS-FET and supplied with a positive source voltage; and
   the drain of said p-channel V-FET is connected to the source of said n-channel MIS-FET and supplied with a negative source voltage.

3. A complementary logic IC according to claim 1, wherein:

the gate of said n-channel V-FET is connected to the source of said n-channel MIS-FET;
the gate of said p-channel V-FET is connected to the source of said p-channel MIS-FET;
the drain of said n-channel V-FET is connected to the drain of said n-channel MIS-FET and supplied with a positive source voltage; and
the drain of said p-channel V-FET is connected to the drain of said p-channel MIS-FET and supplied with a negative source voltage.

4. A complementary logic circuit, having an input terminal for receiving an input signal and an output terminal for providing an inverted output signal, comprising:
   a source voltage supply provided with a positive side and a negative side terminal;
   a first stage circuit comprising a p-channel MIS-FET and n-channel MIS-FET,
   said p-channel MIS-FET having a source connected to the positive side terminal, and a gate connected to the input terminal,
   said n-channel MIS-FET having a drain connected to a drain of the p-channel MIS-FET, a gate connected to the input terminal, and a source connected to the negative side terminal,
   the channel regions of said p-channel MIS-FET and n-channel MIS-FET are positively and negatively biased, respectively,
   and an output stage circuit comprising a p-channel V-FET and a n-channel V-FET,
   said n-channel V-FET having a drain connected to the positive side terminal, a gate connected to the drain of the p-channel MIS-FET, and a source connected to the output terminal,
   said p-channel V-FET having a source connected to the output terminal, a gate connected to the drain of the n-channel MIS-FET, and a drain connected to the negative side terminal.

5. A complementary logic circuit, having an input terminal for receiving an input signal and an output terminal for providing a non-inverted output signal, comprising:
   a source voltage supply provided with a positive side and a negative side terminal;
   a first stage circuit comprising a n-channel MIS-FET and p-channel MIS-FET,
   said n-channel MIS-FET having a drain connected to the positive side terminal, and a gate connected to the input terminal,
   said p-channel MIS-FET having a source connected to a source of the n-channel MIS-FET, a gate connected to the input terminal, and a drain connected to the negative side terminal,
   the channel regions of said p-channel MIS-FET and n-channel MIS-FET are positively and negatively biased, respectively, and
   an output stage circuit comprising a p-channel V-FET and a n-channel V-FET,
   said n-channel V-FET having a drain connected to the positive side terminal, a gate connected to the source of the n-channel MIS-FET, and a source connected to the output terminal,
   said p-channel V-FET having a source connected to the output terminal, a gate connected to the source of the n-channel MIS-FET, and a drain connected to the negative side terminal.

* * * * *